United States Patent
Cideciyan et al.

(10) Patent No.: US 8,472,130 B2
(45) Date of Patent: *Jun. 25, 2013

(54) TRACK-DEPENDENT DATA RANDOMIZATION MITIGATING FALSE VFO DETECTION

(75) Inventors: Roy Daron Cideciyan, Rueschlikon (CH); Thomas Mittelholzer, Zurich (CH); Paul J. Seger, Tucson, AZ (US); Keisuke Tanaka, Tokyo (JP)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/459,367

(22) Filed: Apr. 30, 2012

(65) Prior Publication Data

US 2012/0307389 A1 Dec. 6, 2012

Related U.S. Application Data

(63) Continuation of application No. 13/149,905, filed on Jun. 1, 2011.

(51) Int. Cl.
*G11B 20/10* (2006.01)

(52) U.S. Cl.
USPC .................. 360/39; 360/48; 360/51

(58) Field of Classification Search
None
See application file for complete search history.

(56) References Cited

U.S. PATENT DOCUMENTS

| | | | |
|---|---|---|---|
| 5,233,592 A | 8/1993 | Suzuki et al. | |
| 5,541,960 A | 7/1996 | Satomura et al. | |
| 5,999,110 A | 12/1999 | Blaum et al. | |
| 6,392,829 B1 | 5/2002 | Stoutenburgh et al. | |
| 6,539,514 B1 * | 3/2003 | Bartlett | 714/761 |
| 6,560,727 B1 * | 5/2003 | Pierson et al. | 714/704 |
| 7,020,062 B2 | 3/2006 | Kuroda et al. | |
| 7,810,012 B1 | 10/2010 | Boyer et al. | |
| 2001/0034869 A1 * | 10/2001 | Gray | 714/761 |
| 2001/0036357 A1 | 11/2001 | Tauchi et al. | |
| 2005/0078398 A1 | 4/2005 | Hutchins | |
| 2009/0150637 A1 | 6/2009 | Hattori et al. | |

FOREIGN PATENT DOCUMENTS

| | | |
|---|---|---|
| CN | 1334562 A | 2/2002 |
| CN | 1334562A A | 2/2002 |
| CN | 1606063 A | 4/2005 |
| CN | 1606063A A | 4/2005 |
| JP | 2006294183 A | 10/2006 |

OTHER PUBLICATIONS

PCT International Search Report and Written Opinion, Application No. PCT/CN2012/076089, Aug. 16, 2012.
Standard ECMA-319, Standardizing Information and Communication Systems, Data Interchange on 12,7 mm 384-Track Magnetic Tape Cartridges — Ultrium-1 Format, Jun. 2001, http:/ /www.ecma.ch.
PCT International Search Report and Written-Opinion, Application No. PCT/CN2012/076089, Aug. 16, 2012.

* cited by examiner

*Primary Examiner* — Regina N Holder
(74) *Attorney, Agent, or Firm* — Nelson and Nelson; Daniel P. Nelson; Alexis V. Nelson (57) ABSTRACT

A method for randomizing data to mitigate false VFO detection is described. In one embodiment, such a method includes simultaneously receiving multiple input data streams. Each input data stream is associated with a different track on a magnetic tape medium. The input data streams are simultaneously scrambled to produce multiple randomized data streams. The input data streams are scrambled such that different bit patterns are produced in the randomized data streams even where corresponding bit patterns in the input data streams are identical. The randomized data streams are simultaneously written to their associated data tracks on the magnetic tape medium.

10 Claims, 10 Drawing Sheets

| Track Number | Preset Value |
|---|---|
| 0  | 0 0 0 0 0 0 0 1 0 0 0 0 0 0 0 |
| 1  | 1 1 0 0 1 1 1 1 0 1 1 0 1 0 1 |
| 2  | 1 0 1 1 0 1 0 0 1 1 1 1 0 1 0 |
| 3  | 1 1 1 1 1 0 0 0 1 1 0 1 0 0 1 |
| 4  | 1 0 0 1 0 1 1 1 1 1 0 0 1 0 1 |
| 5  | 0 0 0 1 1 1 0 1 1 1 1 1 1 0 1 |
| 6  | 1 1 0 0 0 0 0 1 1 0 1 0 1 1 1 |
| 7  | 1 0 0 0 1 0 1 1 1 0 0 0 1 1 0 |
| 8  | 1 1 1 1 0 1 0 0 1 1 0 1 0 1 1 |
| 9  | 0 1 1 0 0 0 1 0 0 0 0 0 1 0 0 |
| 10 | 1 1 0 0 1 1 1 1 1 0 1 0 1 0 0 1 |
| 11 | 1 0 0 0 0 1 1 1 1 0 0 1 0 1 0 |
| 12 | 0 0 0 1 1 0 0 0 1 0 1 0 0 1 0 |
| 13 | 1 1 0 0 0 0 0 0 1 0 0 1 1 0 1 |
| 14 | 1 0 1 0 0 0 1 0 1 1 0 0 0 0 0 |
| 15 | 0 1 0 0 1 0 1 1 0 0 1 0 0 0 0 |
| 16 | 0 1 1 0 1 0 0 1 1 0 1 0 1 1 1 |
| 17 | 0 1 1 1 0 0 0 1 0 1 0 0 0 0 1 |
| 18 | 1 1 1 0 0 1 0 0 0 1 1 1 1 0 0 |
| 19 | 0 1 1 0 0 1 1 0 0 0 1 0 0 0 1 |
| 20 | 1 1 0 1 0 1 0 0 1 1 1 1 0 0 0 |
| 21 | 0 1 1 1 1 1 0 0 0 0 0 1 0 0 1 |
| 22 | 1 0 0 1 0 0 1 0 1 1 0 0 0 0 0 |
| 23 | 0 1 0 1 0 0 0 0 1 1 0 1 1 1 1 |
| 24 | 1 0 1 1 1 0 0 0 0 1 0 0 0 0 1 |
| 25 | 1 1 1 0 0 1 1 0 0 0 1 0 0 0 0 |
| 26 | 0 1 1 0 0 0 0 1 1 0 1 0 0 0 0 |
| 27 | 0 0 0 0 0 1 1 0 1 1 0 0 1 1 1 |
| 28 | 1 1 1 1 1 0 1 1 1 1 0 0 1 0 0 |
| 29 | 1 0 1 1 0 1 0 1 0 1 1 0 0 1 1 |
| 30 | 0 1 0 0 0 1 0 1 0 1 1 0 0 1 0 |
| 31 | 0 0 1 1 0 0 0 1 0 1 1 0 0 0 1 |

Fig. 9

| Track Number | Preset Value |
|---|---|
| 0  | 0 0 0 0 0 0 0 1 0 0 0 0 0 0 0 |
| 1  | 0 1 0 0 0 1 1 1 1 1 1 1 1 1 1 |
| 2  | 0 1 1 1 0 0 1 1 0 0 1 1 0 1 0 |
| 3  | 0 0 0 1 1 1 1 0 0 1 1 1 0 0 0 |
| 4  | 0 1 1 1 1 1 0 1 0 1 1 1 1 0 1 |
| 5  | 1 0 1 1 0 1 0 1 1 1 0 1 1 1 0 |
| 6  | 1 1 0 1 0 1 0 0 0 0 0 1 0 0 1 |
| 7  | 0 0 1 1 0 1 0 0 0 1 0 1 0 1 0 |
| 8  | 1 1 0 0 1 1 1 1 0 1 1 0 1 0 1 |
| 9  | 1 0 1 1 1 0 1 1 0 0 0 1 0 0 0 |
| 10 | 0 1 1 1 0 1 1 0 1 1 0 0 1 1 1 |
| 11 | 0 1 0 0 1 0 0 0 0 1 0 0 0 0 0 |
| 12 | 1 0 0 1 0 0 0 1 1 1 1 0 0 1 1 |
| 13 | 1 1 0 0 1 0 0 0 0 0 1 0 1 1 1 |
| 14 | 0 1 1 0 1 0 0 0 0 0 0 0 1 1 1 |
| 15 | 0 1 1 0 1 0 1 0 0 1 0 0 0 1 0 |
| 16 | 1 0 1 1 0 1 0 0 1 1 1 1 0 1 0 |
| 17 | 1 0 0 1 0 0 0 1 0 0 1 0 1 1 0 |
| 18 | 0 0 1 1 1 0 1 0 1 0 0 1 1 1 1 |
| 19 | 1 0 0 1 0 0 1 0 0 0 1 0 0 1 1 |
| 20 | 1 1 1 1 0 0 1 0 0 0 1 0 1 1 1 |
| 21 | 0 1 0 1 1 0 0 0 0 0 0 0 0 1 1 |
| 22 | 0 1 0 0 0 0 0 0 0 1 1 1 0 0 0 |
| 23 | 0 1 0 1 0 0 1 0 1 0 0 1 1 0 1 |
| 24 | 1 1 1 1 0 0 0 1 1 0 1 0 0 1 |

1 1 1 1 0 0 0 1 1 0 1 0 0 0 1

| Track Number | Preset Value |
|---|---|
| 24 | 1 1 1 1 0 0 0 1 1 0 1 0 0 0 1 |
| 25 | 0 0 0 1 1 0 0 1 1 0 1 0 0 1 0 |
| 26 | 0 1 0 1 1 0 0 1 1 1 0 0 1 0 |
| 27 | 1 1 1 1 0 1 1 1 1 1 1 1 1 1 1 |
| 28 | 1 0 1 0 0 1 1 0 0 1 1 1 1 0 0 |
| 29 | 0 0 1 1 1 1 0 1 1 1 1 1 0 1 0 |
| 30 | 1 0 1 1 1 1 0 0 0 1 1 0 1 0 0 |
| 31 | 1 0 1 0 0 1 1 0 0 1 1 1 0 0 0 |

Fig. 10

TRACK-DEPENDENT DATA RANDOMIZATION MITIGATING FALSE VFO DETECTION

FIELD OF THE INVENTION

This invention relates to magnetic tape recording, and more particularly to apparatus and methods for eliminating or minimizing false VFO pattern detection.

BACKGROUND OF THE INVENTION

In current linear tape open (LTO) and enterprise-level tape drives, variable-frequency oscillator (VFO) patterns are a fundamental component of data recording and synchronization. Such VFO patterns may be used to align clock frequencies and bit locations. They may also be used to perform master resets, thereby causing circuits and/or timing to be reset to initial conditions. If a VFO pattern that exists on tape is not detected, or data that is not a VFO pattern is mistakenly determined to be a VFO pattern, serious systematic problems may occur when attempting to read data from tape. In some cases, data on the magnetic tape may not be recoverable Although VFO patterns are intended to be unique from patterns encountered in normal data, matching patterns (hereinafter referred to as "false VFO patterns") may still occur in normal recorded data. One approach to avoid this problem is to require that multiple tracks contain VFO patterns simultaneously. This approach works well in cases where data on each track is independent, since the data on each track is unlikely to contain the same false VFO pattern simultaneously. However, in cases where multiple tracks have the same or very similar data, such as in cases where certain test data patterns are written to tape, this approach may fail.

Another approach to avoid false VFO detection is to use a longer VFO pattern and require that all bits match the VFO pattern. One drawback of this approach is that it increases the probability that actual VFO patterns will be missed, since any error or media defect may cause the longer VFO patterns to go undetected. Another drawback of this approach is that longer VFO patterns reduce storage format efficiency, since the longer VFO patterns consume more storage space.

Yet another approach to avoid false VFO detection is to adjust the size of a VFO-detection window. However, adjusting the size of the VFO-detection window provides a tradeoff. If the VFO-detection window is large, the probability of detecting an actual VFO pattern is reduced, since any error or media defect may cause the actual VFO pattern to go undetected. If the VFO-detection window is small, the probability of detecting a false VFO pattern is increased.

In view of the foregoing, what are needed are improved apparatus and methods to avoid or minimize false VFO detection. Ideally, such apparatus and methods will minimize the chance that certain types of data, such as test data or other repeating data patterns, will cause a VFO to be falsely detected. Further needed are apparatus and methods to provide the above-stated benefits without reducing storage format efficiency.

SUMMARY

The invention has been developed in response to the present state of the art and, in particular, in response to the problems and needs in the art that have not yet been fully solved by currently available apparatus and methods. Accordingly, the invention has been developed to provide apparatus and methods to mitigate false VFO detection in tape drives.

The features and advantages of the invention will become more fully apparent from the following description and appended claims, or may be learned by practice of the invention as set forth hereinafter.

Consistent with the foregoing, a method for randomizing data to mitigate false VFO detection is disclosed herein. In one embodiment, such a method includes simultaneously receiving multiple input data streams. Each input data stream is associated with a different track on a magnetic tape medium. The input data streams are simultaneously scrambled to produce multiple randomized data streams. The input data streams are scrambled such that different bit patterns are produced in the randomized data streams even where corresponding bit patterns in the input data streams are identical. The randomized data streams are simultaneously written to their associated data tracks on the magnetic tape medium.

In another aspect of the invention, an apparatus for randomizing data to mitigate false VFO detection includes multiple data randomizers to receive multiple input data streams in parallel. Each input data stream and each data randomizer is associated with a particular track on a magnetic tape medium. The multiple data randomizers are configured to scramble the input data streams to produce multiple randomized data streams. The data randomizers are configured to produce different bit patterns in the randomized data streams even where corresponding bit patterns in the input data streams are identical.

BRIEF DESCRIPTION OF THE DRAWINGS

In order that the advantages of the invention will be readily understood, a more particular description of the invention briefly described above will be rendered by reference to specific embodiments illustrated in the appended drawings. Understanding that these drawings depict only typical embodiments of the invention and are not therefore to be considered limiting of its scope, the invention will be described and explained with additional specificity and detail through use of the accompanying drawings, in which.

DETAILED DESCRIPTION

It will be readily understood that the components of the present invention, as generally described and illustrated in the Figures herein, could be arranged and designed in a wide variety of different configurations. Thus, the following more detailed description of the embodiments of the invention, as represented in the Figures, is not intended to limit the scope of the invention, as claimed, but is merely representative of certain examples of presently contemplated embodiments in accordance with the invention. The presently described embodiments will be best understood by reference to the drawings, wherein like parts are designated by like numerals throughout.

As will be appreciated by one skilled in the art, the present invention may be embodied as an apparatus, system, method, or computer program product. Furthermore, the present invention may take the form of a hardware embodiment, a software embodiment (including firmware, resident software, microcode, etc.) configured to operate hardware, or an embodiment combining both software and hardware elements. Each of these embodiments may be represented by one or more modules or blocks. Furthermore, the present invention may take the form of a computer-usable storage medium embodied in any tangible medium of expression having computer-usable program code stored therein.

Any combination of one or more computer-usable or computer-readable storage medium(s) may be utilized to store the computer program product. The computer-usable or computer-readable storage medium may be, for example but not limited to, an electronic, magnetic, optical, electromagnetic, infrared, or semiconductor system, apparatus, or device. More specific examples (a non-exhaustive list) of the computer-readable storage medium may include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CDROM), an optical storage device, or a magnetic storage device. In the context of this document, a computer-usable or computer-readable storage medium may be any medium that can contain, store, or transport the program for use by or in connection with the instruction execution system, apparatus, or device.

Computer program code for carrying out operations of the present invention may be written in any combination of one or more programming languages, including an object-oriented programming language such as Java, Smalltalk, C++, or the like, and conventional procedural programming languages, such as the "C" programming language or similar programming languages. Computer program code for implementing the invention may also be written in a low-level programming language such as assembly language.

The present invention may be described below with reference to flowchart illustrations and/or block diagrams of methods, apparatus, systems, and computer program products according to embodiments of the invention. It will be understood that each block of the flowchart illustrations and/or block diagrams, and combinations of blocks in the flowchart illustrations and/or block diagrams, may be implemented by computer program instructions or code. The computer program instructions may be provided to a processor of a general-purpose computer, special-purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be stored in a computer-readable storage medium that can direct a computer or other programmable data processing apparatus to function in a particular manner, such that the instructions stored in the computer-readable storage medium produce an article of manufacture including instruction means which implement the function/act specified in the flowchart and/or block diagram block or blocks. The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

Figure 1:
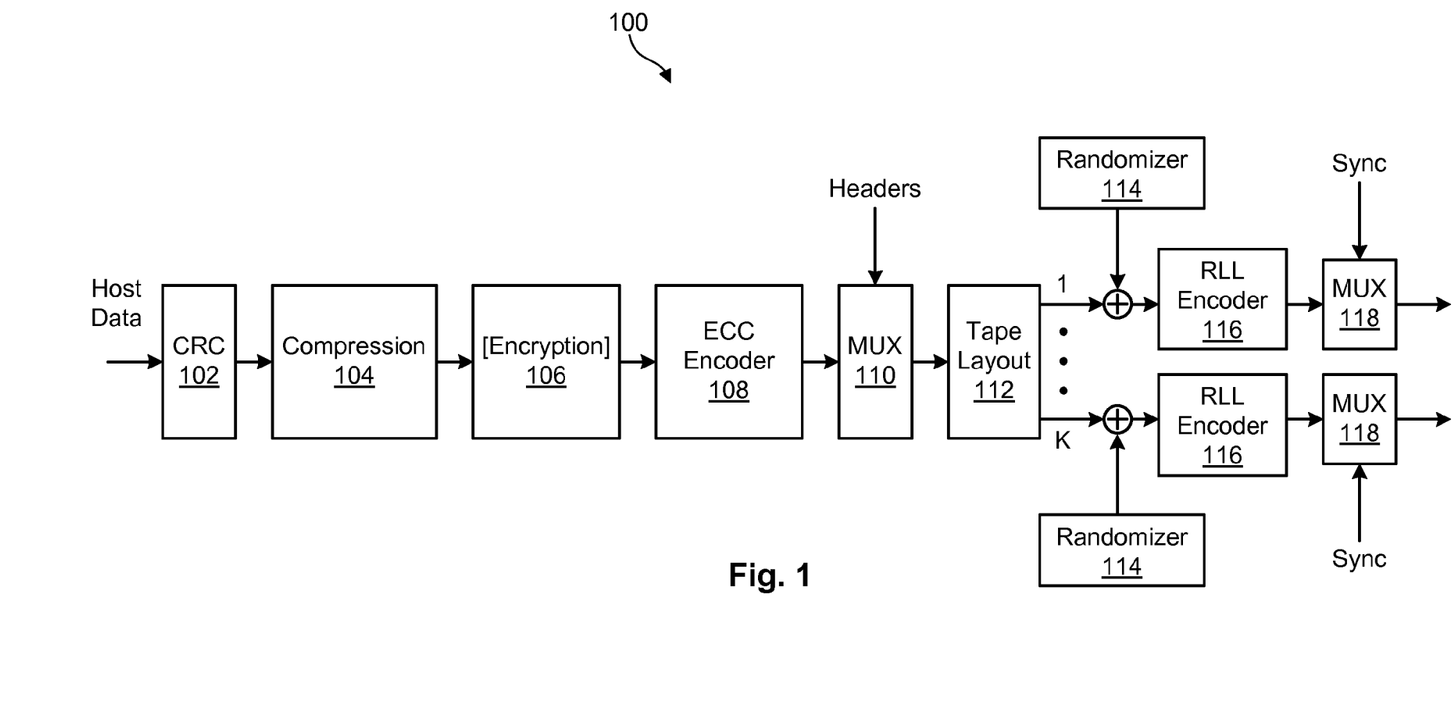
FIG. 1 is a high-level block diagram showing one example of a data flow for a tape drive.

Referring to FIG. 1, a high-level block diagram showing a data flow 100 for a tape drive, such as an LTO or enterprise-level tape drive, is illustrated. As shown, a cyclic redundancy check (CRC) module 102 receives variable-length blocks of data from a host device. The CRC module 102 may add CRC information to these blocks. A compression module 104 may then compress the blocks and an encryption module 106 may optionally encrypt the blocks. The blocks of data may then be broken into data sets of fixed size, which may in turn be broken into sub data sets (SDS) of fixed size. Each SDS may be organized into a two-dimensional array of data. Each SDS data array may then be passed to an ECC encoder 108. The ECC encoder 108 may generate ECC parity for each row in the data array and each column in the data array. This row ECC parity and column ECC parity may be appended to the array.

Once the ECC parity is appended to the array, a multiplexer 110 may add headers to the rows in the data array (including the column ECC parity and the row ECC parity). In certain embodiments, the headers contain error detection codes such as CRCs. In the illustrated embodiment, the headers are not protected by the row or column ECC parity described above. In other embodiments, headers may be added to the data array prior to calculating the row ECC parity. The row ECC parity may then be computed to include the headers. This will ensure that the headers are protected by at least one dimension of ECC parity. In other embodiments, the headers may be added to the data array after the row ECC parity has been calculated. The row ECC parity may then be recomputed to include the headers.

A tape layout module 112 may distribute the extended data array, including the ECC parity and headers, across K different tracks and in different orders on the magnetic tape. The data sequences produced by the tape layout module 112 may be further processed with randomizers 114 to perform additional signal processing on the data. More specifically, the randomizers 114 may be used to transform the incoming data to create an output that is a pseudorandom sequence of "1"s and "0"s. This removes periodicity as much as possible from the incoming data. Run length limited (RLL) encoders 116 may process the randomized data streams to prevent unwanted patterns (e.g., long runs of "1"s or "0"s or other undesired patterns) from occurring in the data. Multiplexers 118 may multiplex synchronization information, such as variable frequency oscillator (VFO) patterns, sync characters, or the like, into the information to enable it to be synchronized when read.

The resulting data may then be sent to write drivers (not shown) which may cause current to flow through recording head elements to generate magnetic flux and thereby write the data to the tracks of the magnetic recording medium. In general, each of the blocks or modules to the right of the multiplexer 110 performs different transformations on the data to make it more suitable for magnetic recording.

Figure 2:
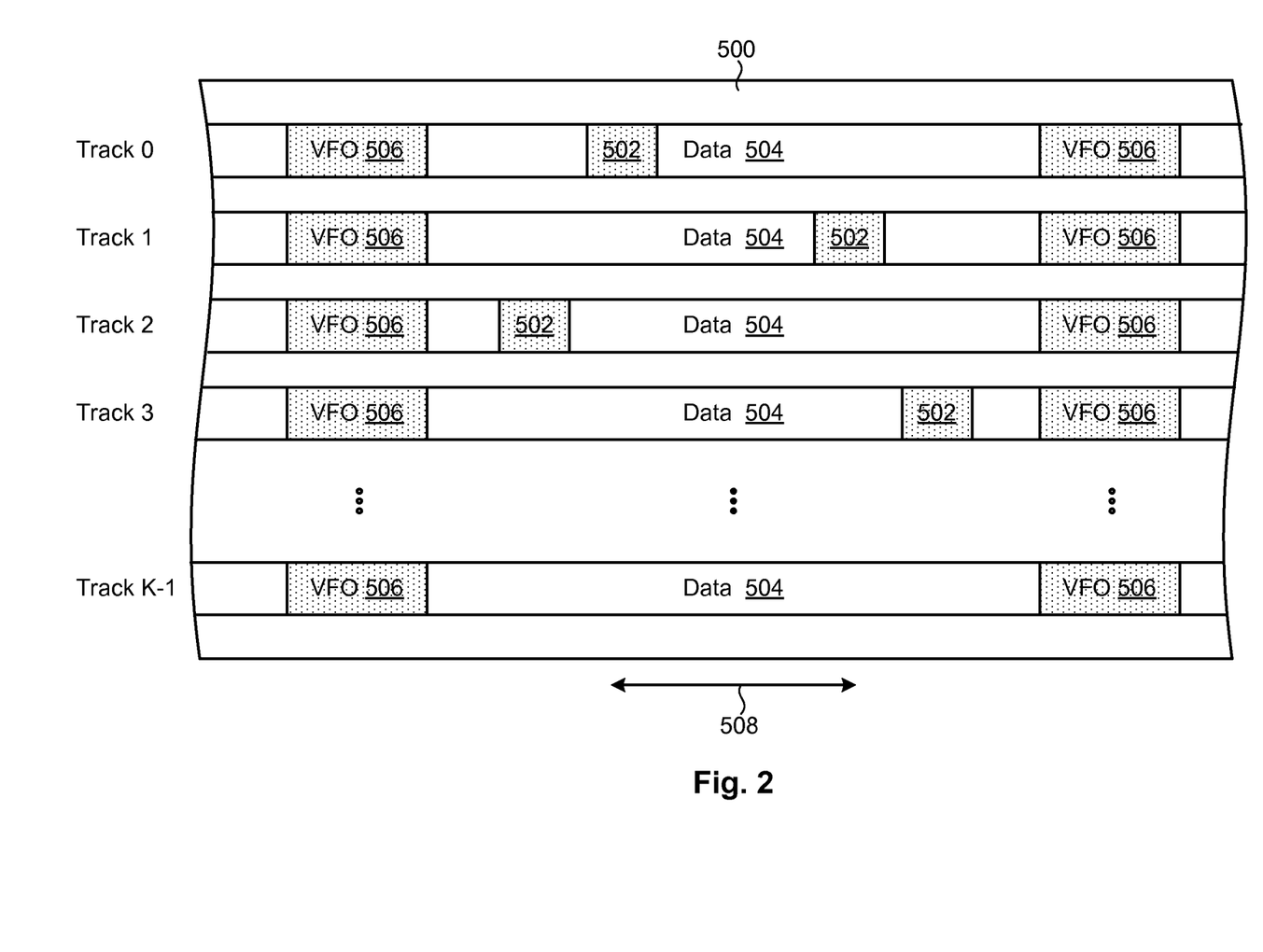
FIG. 2 is a high-level block diagram showing one example of actual VFO patterns and non-aligned false VFO patterns occurring on tape.

Referring to FIG. 2, as previously mentioned, VFO patterns may be inserted into recorded data for synchronization and other purposes. In current LTO and enterprise-level tape drives, VFO patterns are made up of 2T magnetic recording patterns with a 4-bit period, where T corresponds to a recorded bit. VFO patterns in the NRZI notation are sequences of the type 1 0 1 0 1 0 1 0 . . . , where "0" denotes no change in the direction of recorded magnetization and "1" denotes reversal in the direction of recorded magnetization.

The RLL encoder 116 is designed to limit the maximum length of VFO-like 2T-patterns within recorded data to prevent mistakenly detecting a VFO pattern within the data pattern during the read-back process. This guarantees that VFO-like patterns will not be detected in data unless the read-back data is corrupted by errors such as noise or media defects. However, false VFO detection may occur in the presence of noise if the noise occurs within a VFO-detection window.

FIG. 2 illustrates how VFO patterns are detected in the case of normal random data. As can be observed, VFO-like patterns 502 may occur in data 504 recorded on tracks of the magnetic tape 500. Because the data 504 on each track in independent, the VFO-like patterns 502 may be distributed randomly in an along-track direction 508. This contrasts with actual VFO patterns 506, which are purposely aligned in the along-track direction 508. Although false VFO patterns may be detected in specific tracks, a tape drive may include voting-logic circuitry to detect VFO patterns in a group of N≦K tracks. This voting-logic circuitry may raise a VFO-detection flag if and only if VFO patterns are detected in at least N' tracks, where 1<N'≦N. For example, where K=8, 16, or 32 tracks, the total number of tracks may be divided into groups of four tracks, and the voting-logic circuitry may only raise the VFO-detection flag if a VFO pattern is detected in the same along-track location in three out of the four tracks in each of the groups of four tracks. This concept is illustrated in FIG. 3.

Figure 3:
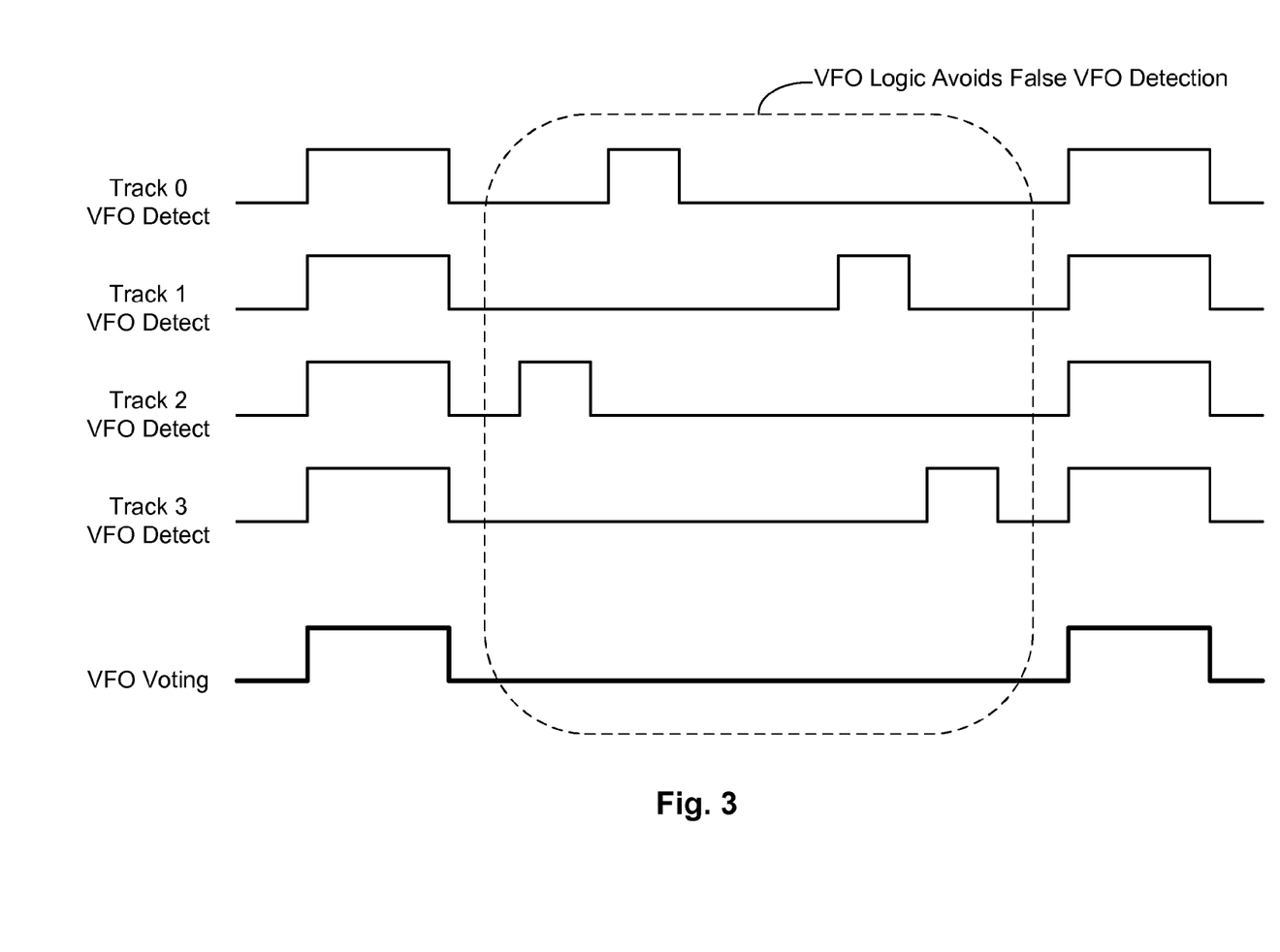
FIG. 3 shows how voting logic may be used to avoid false VFO detection for the non-aligned false VFO patterns illustrated in FIG. 2.

Referring to FIG. 3, while continuing to refer generally to FIG. 2, although VFO-like patterns 502 are detected at various locations in each of a group of four tracks, the VFO-detection flag is only raised if a specified number of VFO-like patterns 502 occur simultaneously in the four tracks. Since only a single VFO-like pattern 502 occurs at any given time, the VFO voting circuitry will not raise the VFO-detection flag, as shown in FIG. 3. This contrasts with actual VFO patterns 506 which are aligned across the several tracks. As shown in FIG. 3, the voting-logic circuitry raises the VFO-detection flag since a specified number of VFO patterns 506 are detected in the same along-track location.

Figure 4:
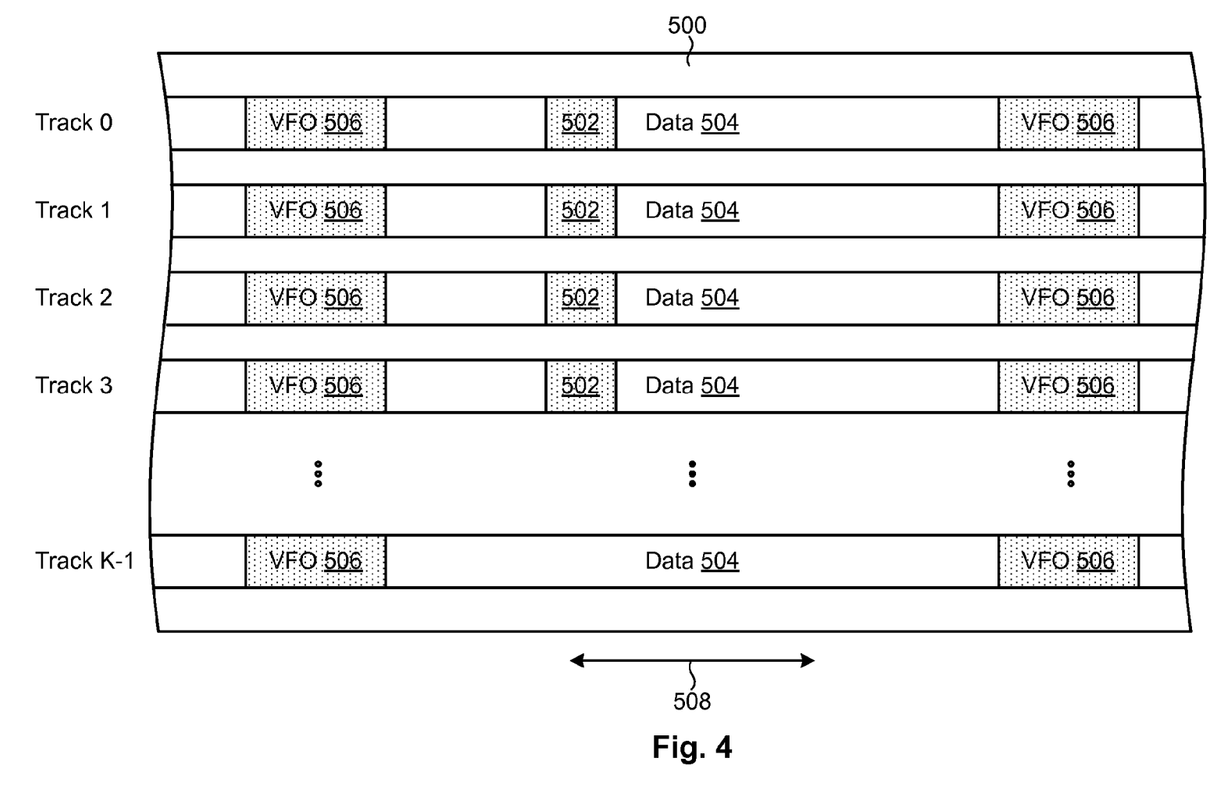
FIG. 4 is a high-level block diagram showing an example of actual VFO patterns and aligned false VFO patterns occurring on tape.
Figure 5:
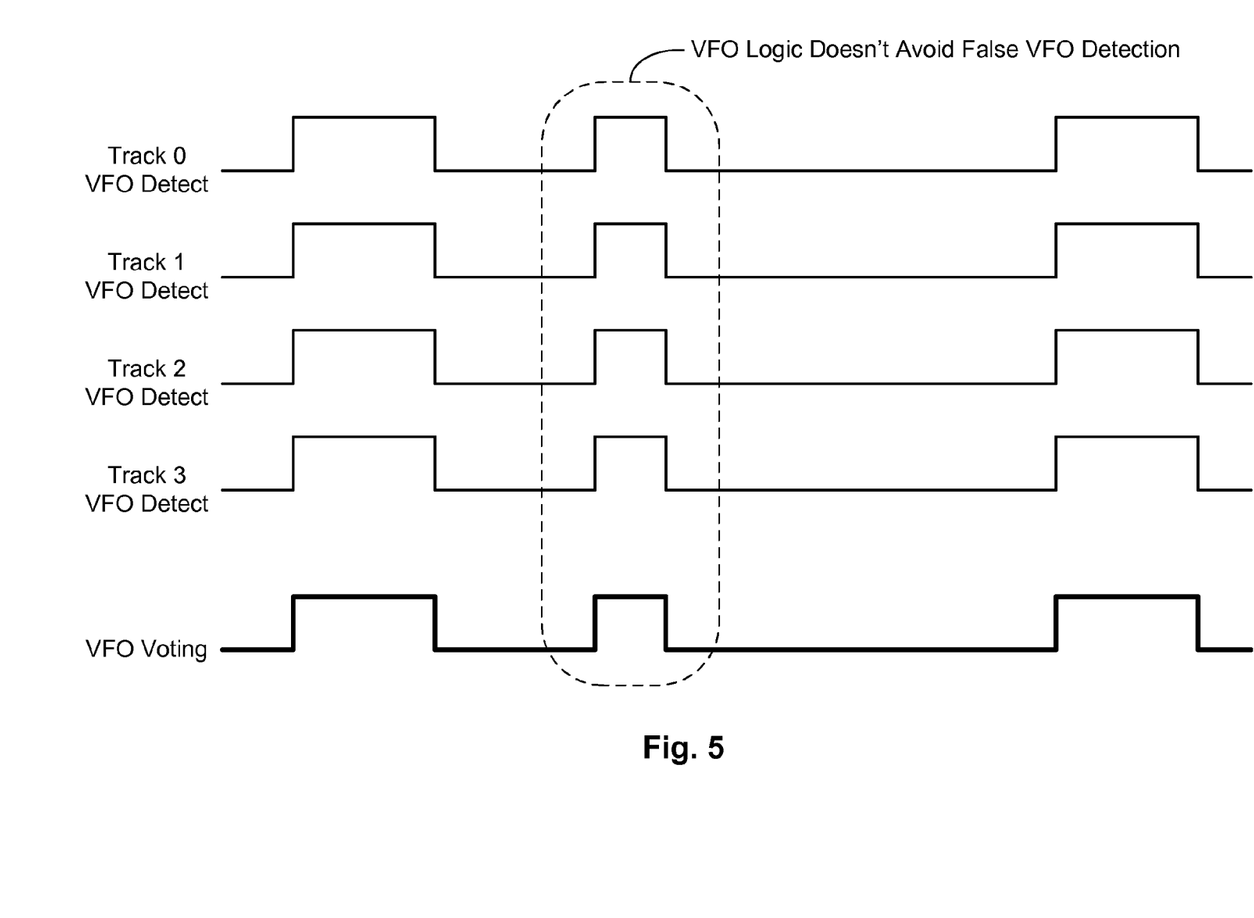
FIG. 5 shows how voting logic is unable to avoid false VFO detection for the aligned false VFO patterns illustrated in FIG. 4.

Referring to FIG. 4, although voting-logic circuitry works well in cases where the data on each track is independent, it may not work as well where VFO-like patterns 502 occur simultaneously on tape 500. Such a situation may occur with test data or other repeating data patterns. One such scenario is illustrated in FIG. 4. As shown in FIG. 4, VFO-like patterns 502 (i.e., false VFO patterns 502) occur simultaneously on multiple tracks. Because these VFO-like patterns 502 occur in the same along-track location, the voting logic circuitry raises the VFO-detection flag (as shown in FIG. 5) to indicate that a VFO pattern has been detected. In this case, the VFO pattern has been falsely detected. This example shows that VFO voting-logic circuitry may not avoid false VFO detection for repeating patterns that occur in the same along-track location.

Figure 6:
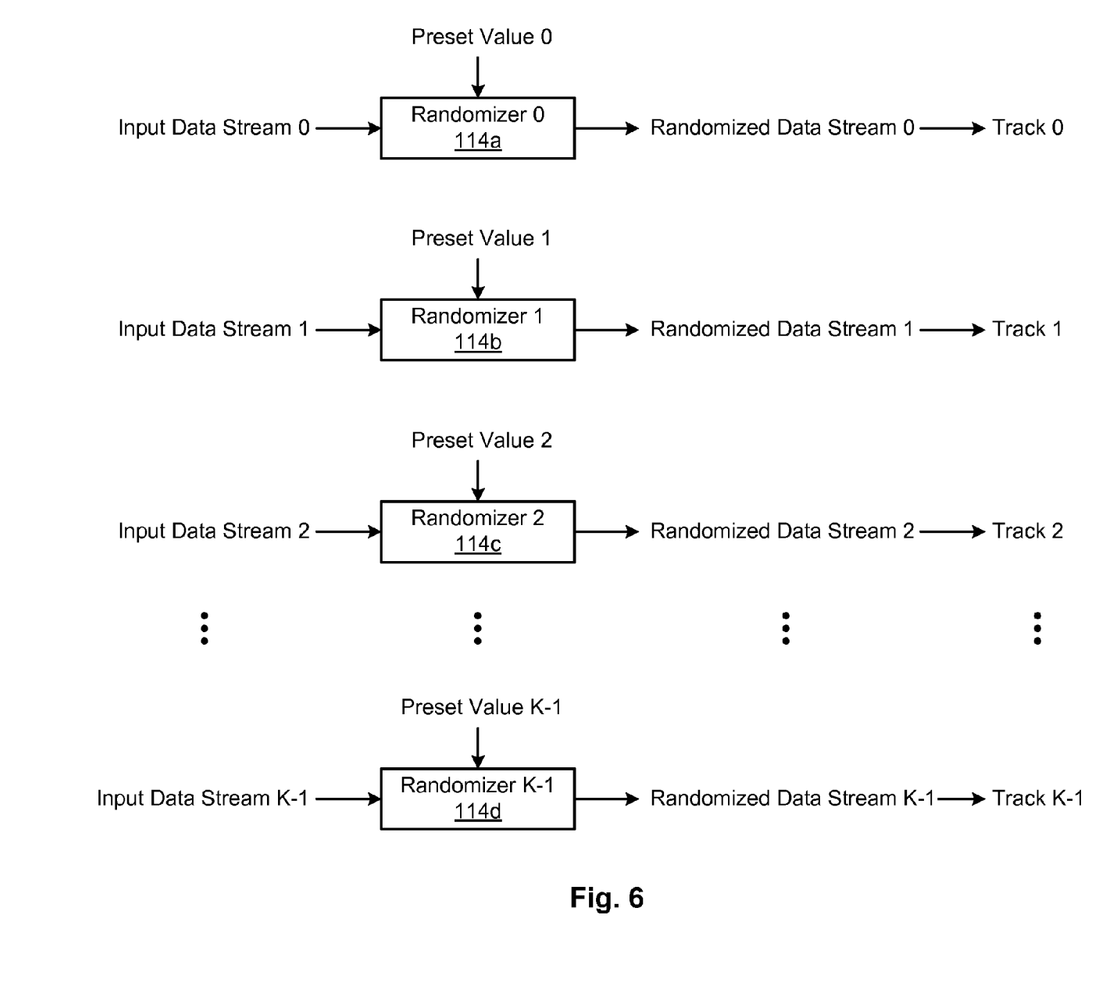
FIG. 6 shows data randomizers for each track initialized with different preset values, thereby producing different randomized data streams for each track even where the input data streams for each track are identical.

Referring to FIG. 6, to mitigate false VFO detection as discussed above, a new and improved technique for writing data to tape is disclosed hereinafter. This technique reduces or prevents false VFO detection not only in the normal case of random data, but also in the case of repeating data, such as repeating test data. As will be described in more detail hereafter, the technique writes different data bit patterns to each track even when incoming host data for each track is the same. This is accomplished by using different preset values (i.e., initial values) to initialize each track's data randomizer 114. As will be explained in more detail hereafter, in one embodiment, the technique initializes K data randomizers 114 with K different preset values, as illustrated in FIG. 6. This technique avoids false VFO detection for normal user data as well as repeating test data while ensuring that actual VFO patterns will be correctly detected.

Figure 7:
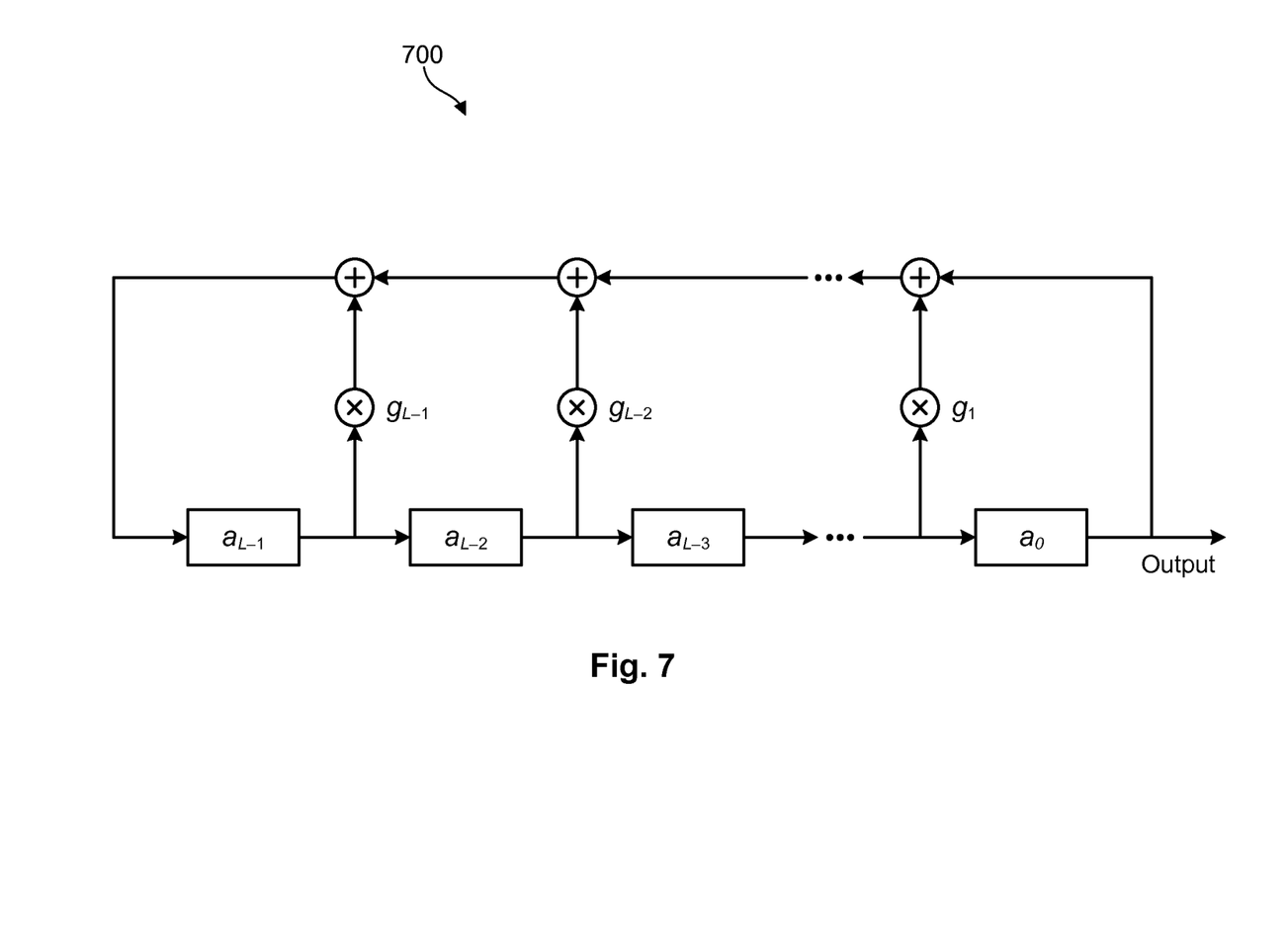
FIG. 7 is a high-level block diagram showing one example of a linear feedback shift register, in this example a Fibonacci implementation of a linear feedback shift register.

FIG. 7 shows a Fibonacci implementation of a linear feedback shift register 700. Such a linear feedback shift register 700 is used in the randomizers 114 of current LTO and enterprise-level tape drives, and may be used in the randomizers 114 used to implement the present invention. In this implementation of a linear feedback shift register 700, all additions and multiplications are performed over a Galois field, also known as a finite field, with two elements GF(2). The addition operation "+" over GF(2) with elements {0, 1} corresponds to modulo-2 addition (0+0=0, 0+1=1, 1+0=1, and 1+1=0), whereas the multiplication operation "x" over GF(2) corresponds to integer multiplication (0×0=0, 0×1=0, 1×0=0, and 1×1=1).

The initial setting (i.e., the seed, preset value, or initial value) of the L-bit shift register 700 in FIG. 7 is represented by the binary values $a_0, a_1, \ldots, a_{L-1}$. The coefficients of the GF(2) multipliers are represented by the binary values $g_1, g_2, \ldots, g_{L-1}$. A binary sequence generated by the linear feedback shift register 700 is a maximal length sequence (m-sequence) if the period of the generated sequence is $2^L-1$ bits for any nonzero initial setting that contains at least one nonzero component. The linear feedback shift register 700 generates an m-sequence if the polynomial $1+g_1x+ \ldots +g_{L-1}x^{L-1}+x^L$ is a primitive polynomial. The sequences generated by the linear feedback shift register 700 illustrated in FIG. 7 satisfy the recurrence $a_n=a_{n-1}g_{L-1}+ \ldots +a_{n-L-1}g_1+a_{n-L}$.

Figure 8:
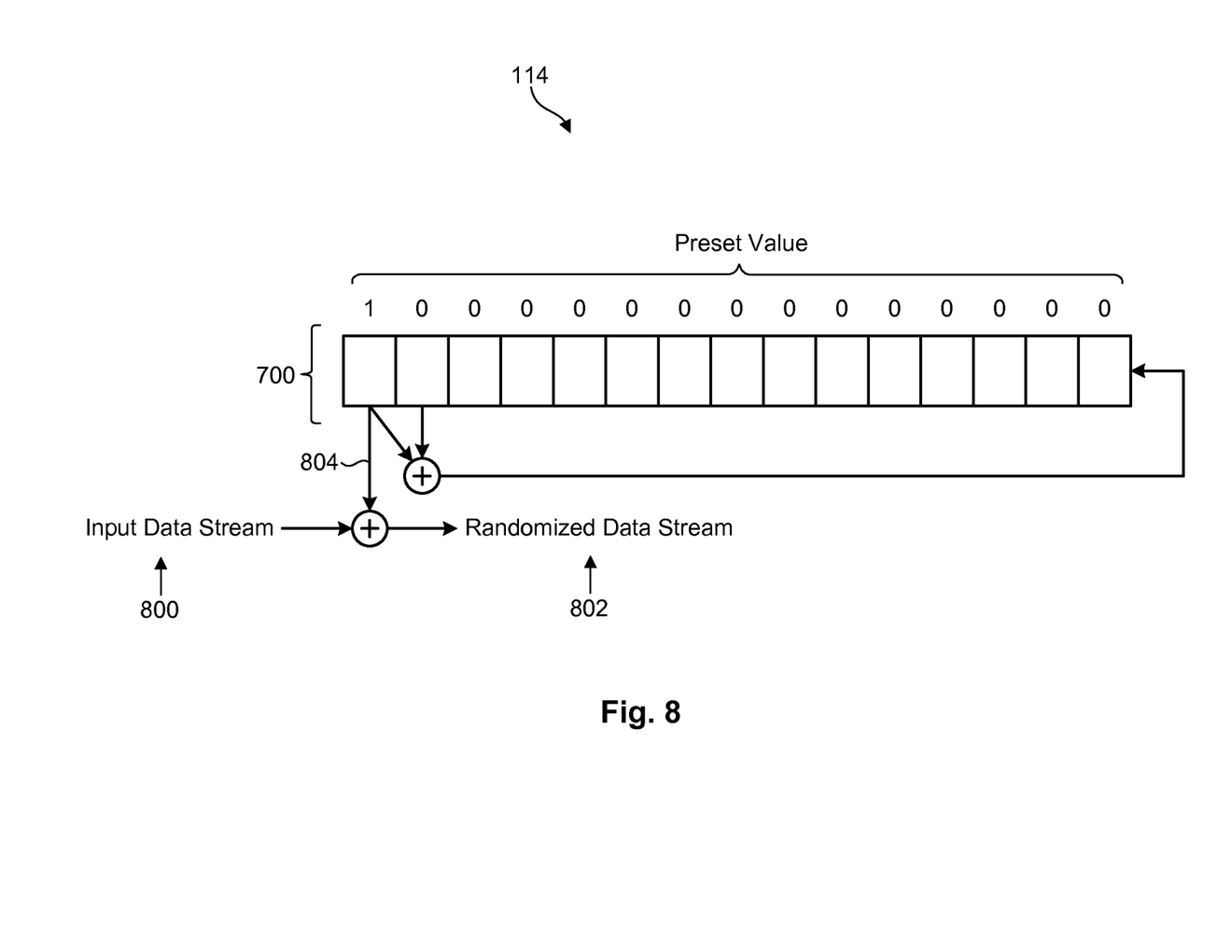
FIG. 8 shows one example of a data randomizer comprising a linear feedback shift register initialized with a preset value.

FIG. 8 shows an example of a data randomizer 114 used in current LTO drives. Such a data randomizer 114 may be used to implement the improved data writing techniques disclosed herein. Data randomization in LTO tape drives is based on synchronous scrambling also known as additive scrambling that adds a pseudorandom binary sequence (m-sequence) generated by a linear feedback shift register circuit 700, such as the circuit 700 illustrated in FIG. 7, to a binary input data stream 800 using a modulo-2 adder (exclusive-or (XOR) logical gate). In LTO, a 15-bit shift register 700 is used that limits the period of the pseudorandom binary sequence to $2^{15}-1=32767$ bits. The primitive polynomial used in LTO to define the sequence of the linear feedback shift register 700 is given by $g(x)=1+x+x^{15}$.

In conventional LTO tape drives, data randomizers 114 used in all K tracks are preset to the same value at the beginning of a header preceding a codeword interleave (CWI). In other words, the initial state of the linear feedback shift register 700 in the data randomizer 114 does not depend on the logical or physical track to which data is assigned. In LTO, data randomizers 114 of all K tracks are preset to the same 15-bit value (100000000000000) at the beginning of every header preceding a CWI. The headers on all K tracks are recorded at the same time, meaning that they occur at approximately the same along-track location on the tape 500.

Figure 9:
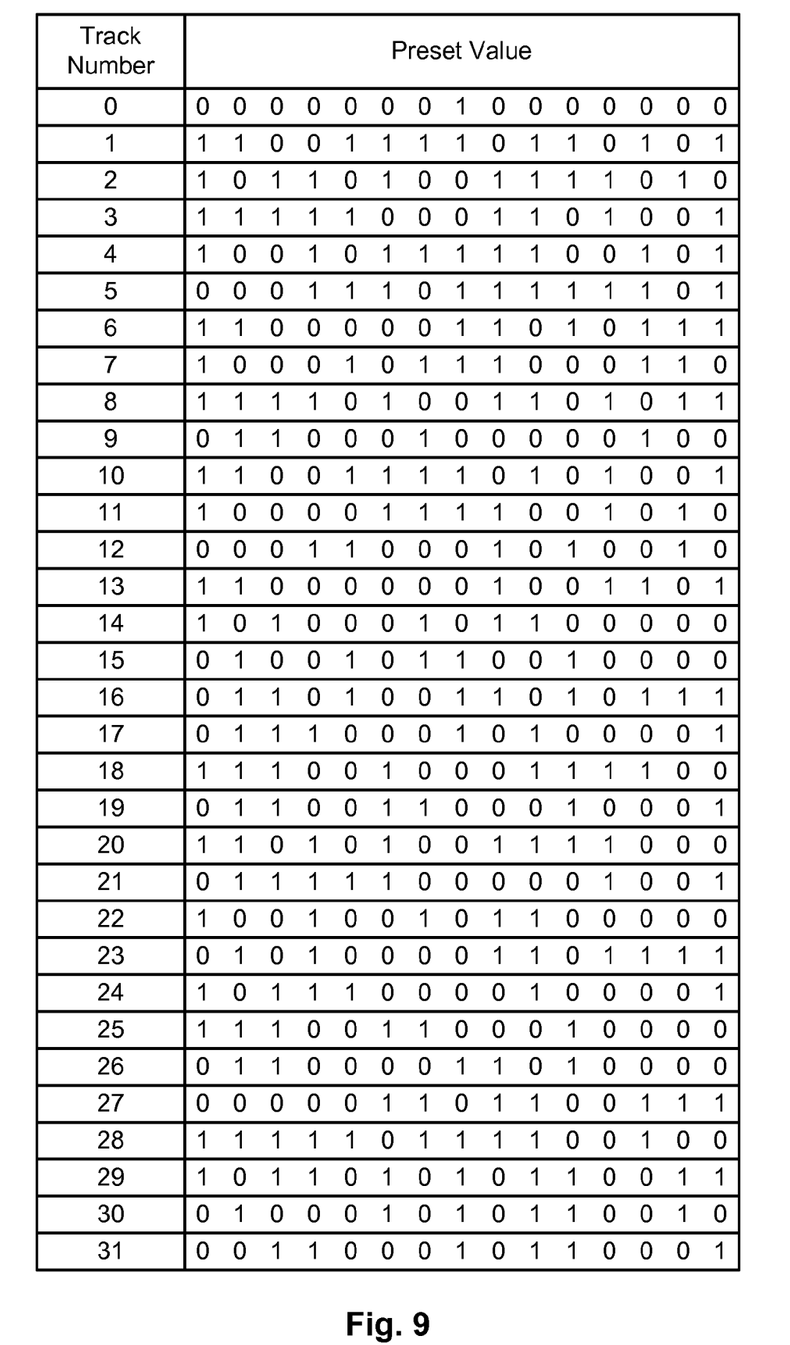
FIG. 9 is a table showing a first example of preset values that may be used to initialize data randomizers for K=32 tracks.

The initial setting of the LTO data randomizer 114 may be described by the column vector a=[1 0 0 0 0 0 0 0 0 0 0 0 0 0 0]' with 15 integer components. The register content of the LTO randomizer 114 after m clock periods (m bit shifts) may be described using the MATLAB language as follows:

$a=[1\ 0\ 0\ 0\ 0\ 0\ 0\ 0\ 0\ 0\ 0\ 0\ 0\ 0\ 0]';\ \%\ LTO\ preset\ value$ $ag=gf(a, 1);$ $A=\text{horzcat}(\text{zeros}(14, 1), \text{diag}(\text{ones}(1, 14)));$ $B=\text{horzcat}([1\ 1], \text{zeros}(1, 13));$ $Q=\text{vertcat}(A, B);$ $Qg=gf(Q, 1)$ $bg=(Qg\char`^m)*ag;$ The column vector bg contains the content of the randomizer 114 after m clock periods. The above MATLAB code specifies the shift register content of the LTO data randomizer 114 at any desired time that is characterized by m clock periods. As the first component of bg represents the output bit 804 of the data randomizer 114, the output 804 of the randomizer 114 in FIG. 8 is fully specified by the MATLAB code. In one embodiment (such as that discussed in association with FIG. 9), the initial preset value is selected to be a=[0 0 0 0 0 0 0 1 0 0 0 0 0 0 0]'. The first line of the MATLAB code shown above may be replaced by the preset value a to describe the register content of the randomizer 114 after m clock periods.

In certain embodiments, it may be desirable to maximize the minimum "distance" between any two preset values in the pseudorandom binary sequence, where the "distance" corresponds to the number of clock periods required to shift the content of the shift register from one preset value to the next. This may ensure a maximal minimum shift of M clock periods between pseudorandom sequences generated in any two tracks. This maximal minimum shift M may be calculated using the MATLAB language as follows:

$M=\max(\min(\text{mod}(c-\text{circshift}(c, [0\ 1]), 2\char`^L-1)))$ where $c=\text{sort}(\text{mod}([0:F:(K-1)*F],(2\char`^L-1)))$ where F is the number of clock periods between the preset values of adjacent tracks, with the maximization occurring over all possible values of F, and c is the sorted set of all preset values given in clock shifts relative to a first track (track 0). For K=32 tracks and L=15 registers, the maximal minimum shift M is 1023 clock periods.

Example 1

Consider a first example where K=32 tracks and L=15 registers. Using these values, a data randomizer 114 will generate a 32767-bit sequence of pseudorandom patterns in a repeating manner—i.e., the period of the sequence is 32767 bits. In this example, the preset value used to initialize the data randomizer 114a for track 0 is a=[0 0 0 0 0 0 0 1 0 0 0 0 0 0 0]'. The preset value for track 1 is shifted by 996 bytes (i.e., 996×8 bits) relative to the preset value for track 0. This corresponds to a shift of F=7968 clock periods relative to the preset value for track 0.

The preset values for the remaining tracks may be calculated in a similar manner, where the preset value of track t is shifted by 7968 clock periods from track t-1, where t=1, 2, 3, . . . , 31. In this embodiment, the number of clock periods required to shift the preset value for track t relative to track t-1 corresponds exactly to the number of bits contained in a conventional CWI-4 (a codeword interleave with four interleaved codewords, including the header). If the header of the CWI-4 contains 12 bytes and the data of the CWI-4 includes four 246-byte Reed-Solomon codewords, the CWI-4 will contain a total of (12+4×246)×8=7968 bits. In such an embodiment, the unsorted set c (i.e., the unsorted set of preset values for all 32 tracks expressed in clock shifts relative to a first track (track 0)) may be calculated as follows:

$c=(\text{mod}([0:7968:31*7968],(2\char`^15-1)))=\{0, 7968,$
15936, 23904, 31872, 7073, 15041, 23009,
30977, 6178, 14146, 22114, 30082, 5283, 13251,
21219, 29187, 4388, 12356, 20324, 28292, 3493,
11461, 19429, 27397, 2598, 10566, 18534,
26502, 1703, 9671, 17639$\}$ As shown above, the preset values wrap around once they reach 32767 bits. The sorted set c (i.e., the sorted set of preset values for all 32 tracks organized by number of clock shifts) may be calculated as follows:

$c=\text{sort}(\text{mod}([0:7968:31*7968],(2\char`^15-1)))=\{0, 1703,$
2598, 3493, 4388, 5283, 6178, 7073, 7968, 9671,
10566, 11461, 12356, 13251, 14146, 15041,
15936, 17639, 18534, 19429, 20324, 21219,
22114, 23009, 23904, 26502, 27397, 28292,
29187, 30082, 30977, 31872$\}$ As shown above, the concatenation of the block of pseudorandom patterns generated in consecutive tracks results in an m-sequence. The minimum shift of clock periods between two pseudorandom sequences generated in this case may be calculated as follows:

$\min(\text{mod}(c-\text{circshift}(c,[0\ 1]),2\char`^15-1))=895$

Thus, a distance of at least 895 clock periods is present between each of the preset values. This value is close to the maximum possible value M=1023 clock periods. The preset values for all 32 tracks are shown in binary in FIG. 9. As shown, each preset value has 15 bits, corresponding to the size of the linear feedback shift register 700 illustrated in FIG. 8.

Example 2

Figure 10:
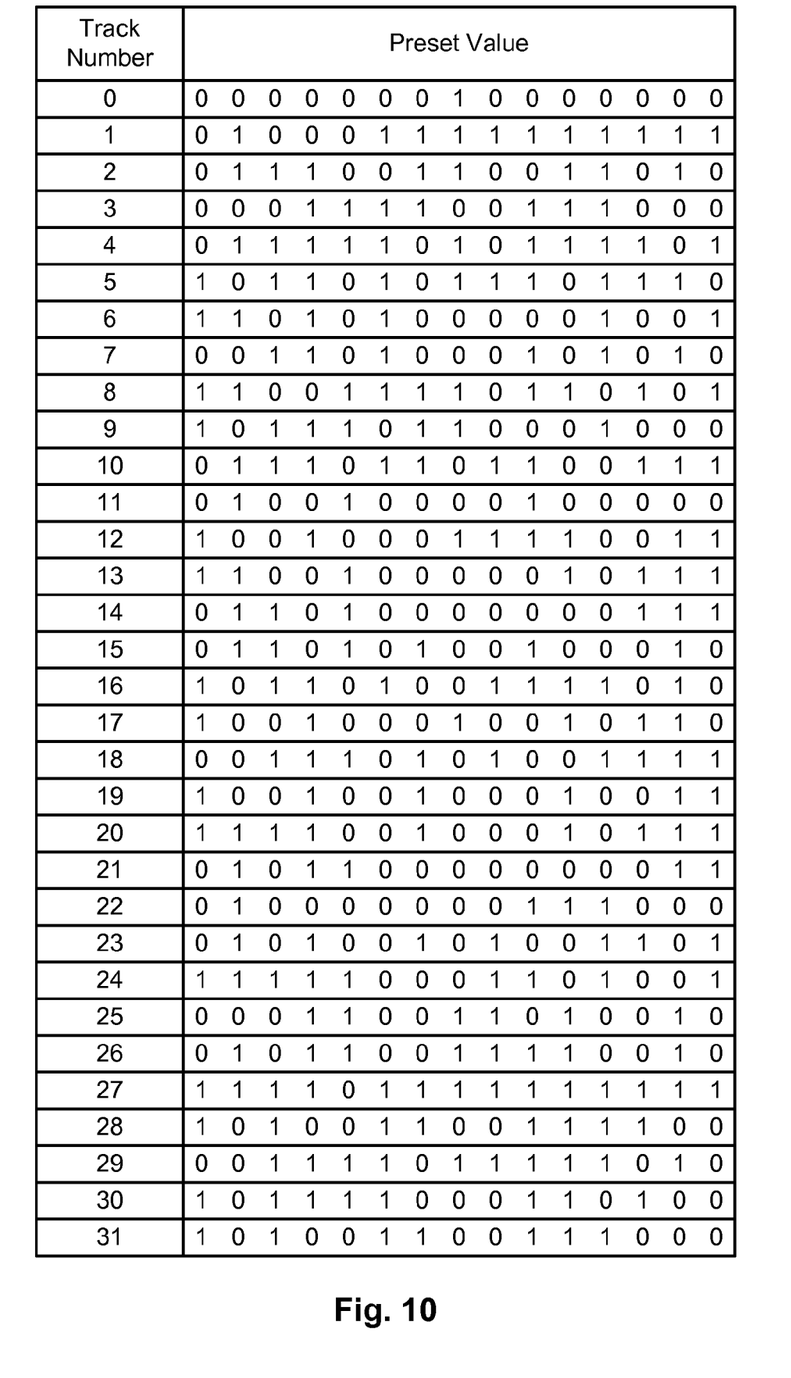
FIG. 10 is a table showing a second example of preset values that may be used to initialize data randomizers for K=32 tracks.

Consider a second example where K=32 tracks and L=15 registers. Using these values, a data randomizer 114 will generate a 32767-bit sequence of pseudorandom patterns in a repeating manner. In this example, the preset value used to initialize the data randomizer 114a for track 0 is a=[0 0 0 0 0 0 0 1 0 0 0 0 0 0 0]'. The preset value for track 1 is shifted by 996 bits relative to the preset value for track 0. This corresponds to a shift of F=996 clock periods relative to the preset value for track 0. In such an embodiment, the unsorted set c is calculated as follows:

$c=(\text{mod}([0:996:31*996],(2\char`^15-1)))=\{0, 996, 1992,$
2988, 3984, 4980, 5976, 6972, 7968, 8964, 9960,
10956, 11952, 12948, 13944, 14940, 15936,
16932, 17928, 18924, 19920, 20916, 21912,
22908, 23904, 24900, 25896, 26892, 27888,
28884, 29880, 30876$\}$ As can be observed above, due to the much smaller value of F, the preset values do not wrap around. Thus, the preset values are ordered from least to greatest without any sorting. The preset values for all 32 tracks are shown in binary in FIG. 10.

The values and hardware/software configurations in the preceding examples are presented only by way of example and are not intended to be limiting. These values and/or configurations may vary in different embodiments. For example, the linear feedback shift register 700 is not limited to a 15-bit linear feedback shift register, but may include linear feedback shift registers of differing sizes. The implementation of a linear feedback shift register may also vary, which may in turn alter the generated pseudorandom sequence. It follows that the preset values, as well as the number of bits in the preset values, may also vary. The "distance" between any two preset values in the pseudorandom binary sequence may also vary in different embodiments. Thus, although the minimum distance was maximized in the above examples, this is not necessary and may not always be desirable. Thus, other distances or spacings between preset values may be used. Other values, such as the number of tracks and associated data randomizers implemented in a tape drive, may also vary.

It should also be recognized that not all K data randomizers 114 are necessarily programmed with different preset values, although this may be the case in some embodiments, such as the embodiments described above. In other embodiments, some number n of the K data randomizers 114, where n is an integer less than K, are programmed with the same preset value. The foregoing description and appended claims are intended to encompass embodiments where multiple (i.e., at least two) data randomizers 114 (that operate in parallel) are programmed with different preset values. The implementation of the tape drive and the manner in which VFO patterns are detected or falsely detected may dictate how many different preset values are needed and which data randomizers 114 are programmed with the same or different preset values.

The flowcharts and block diagrams in the Figures illustrate the architecture, functionality, and operation of possible implementations of systems, methods, and computer-usable storage media according to various embodiments of the present invention. In this regard, each block in the flowcharts or block diagrams may represent a module, segment, or portion of code, which comprises one or more executable instructions for implementing the specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustrations, and combinations of blocks in the block diagrams and/or flowchart illustrations, may be implemented by special purpose hardware-based systems that perform the specified functions or acts, or combinations of special purpose hardware and computer instructions.

The invention claimed is:

1. A method for randomizing data to mitigate false VFO detection, the method comprising:
    simultaneously receiving a plurality of different input data streams, wherein each input data stream is associated with a different track on a magnetic tape medium;
    simultaneously scrambling the input data streams to produce a plurality of randomized data streams, where scrambling comprises producing different bit patterns in the randomized data streams even where corresponding bit patterns in the input data streams are identical; and
    simultaneously writing the randomized data streams to their associated data tracks on the magnetic tape medium such that different bit patterns are written to each track of the magnetic tape medium even where corresponding bit patterns in the input data streams are identical.

2. The method of claim 1, wherein scrambling comprises using a plurality of data randomizers to scramble the incoming data streams.

3. The method of claim 2, further comprising initializing each of the plurality of data randomizers differently prior to scrambling the incoming data streams.

4. The method of claim 2, wherein each of the plurality of data randomizers comprise linear feedback shift registers.

5. The method of claim 4, wherein the linear feedback shift registers are Fibonacci implementations of linear feedback shift registers.

6. The method of claim 4, further comprising initializing the linear feedback shift registers of the plurality of data randomizers with different preset values prior to scrambling the incoming data streams.

7. The method of claim 6, wherein each of the plurality of data randomizers produces a repeating pseudorandom sequence.

8. The method of claim 7, wherein the repeating pseudorandom sequence contains $2^L-1$ bits, where L is the number of bits in each linear feedback shift register.

9. The method of claim 7, wherein initializing the linear feedback shift registers of the plurality of data randomizers comprises initializing the linear feedback shift registers with different preset values from the repeating pseudorandom sequence.

10. The method of claim 9, further comprising substantially maximizing the minimum "distance" between the preset values of the plurality of data randomizers within the repeating sequence, wherein the "distance" corresponds to a number of clock periods required to shift content of the linear feedback shift register from one preset value to the next.

* * * * *